(12) United States Patent
Kum et al.

(10) Patent No.: US 9,513,144 B2
(45) Date of Patent: *Dec. 6, 2016

(54) NON-CONTACT SENSING MODULE AND METHOD OF MANUFACTURING THE SAME

(71) Applicants: Hyundai Motor Company, Seoul (KR); DH Holdings Co., Ltd., Ulsan (KR)

(72) Inventors: Myung-Sub Kum, Whasung-Si (KR); Jong-Sang Noh, Whasung-Si (KR); Jung-Min Lee, Whasung-Si (KR)

(73) Assignees: Hyundai Motor Company, Seoul (KR); DH Holdings Co., Ltd., Ulsan (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/934,408

(22) Filed: Nov. 6, 2015

(65) Prior Publication Data

US 2016/0061632 A1  Mar. 3, 2016

Related U.S. Application Data

(62) Division of application No. 13/920,799, filed on Jun. 18, 2013, now Pat. No. 9,214,936.

(51) Int. Cl.
| | |
|---|---|
| G01R 27/26 | (2006.01) |
| G01D 5/22 | (2006.01) |
| H03K 17/95 | (2006.01) |
| H01H 21/26 | (2006.01) |

(52) U.S. Cl.
CPC ............ *G01D 5/22* (2013.01); *G01R 27/2611* (2013.01); *H01H 21/26* (2013.01); *H03K 17/9502* (2013.01); *H03K 17/9505* (2013.01); *H03K 17/9545* (2013.01); *H01H 2231/026* (2013.01); *Y10T 29/49126* (2015.01)

(58) Field of Classification Search
CPC ....... G01R 27/2611; G01R 27/26; G01R 3/00; H03K 17/9502
USPC .................................................. 324/654–657
See application file for complete search history.

(56) References Cited

U.S. PATENT DOCUMENTS

| | | | | |
|---|---|---|---|---|
| 4,325,040 | A | | 4/1982 | Whitley |
| 4,845,429 | A | * | 7/1989 | Burreson ........... H03K 17/9537 324/207.19 |
| 5,436,441 | A | * | 7/1995 | Inoue ................. G06K 7/10336 235/487 |
| 5,999,409 | A | * | 12/1999 | Ando ............... G06K 19/07749 235/492 |
| 6,782,336 | B2 | * | 8/2004 | Shah ................ G01R 31/31723 324/656 |
| 6,888,438 | B2 | * | 5/2005 | Hui ....................... H01F 27/365 336/200 |
| 7,196,510 | B2 | | 3/2007 | Kawatoko |
| 2007/0236317 | A1 | | 10/2007 | Cheng et al. |
| 2008/0008910 | A1 | | 1/2008 | Koh |
| 2008/0062049 | A1 | | 3/2008 | Castany et al. |
| 2009/0261844 | A1 | | 10/2009 | Howard et al. |
| 2010/0044129 | A1 | * | 2/2010 | Kyle ........................ B60K 6/26 180/65.25 |
| 2011/0187204 | A1 | * | 8/2011 | Lacey .................... H03K 17/96 307/139 |
| 2011/0253310 | A1 | | 10/2011 | Benjamin |

FOREIGN PATENT DOCUMENTS

| | | |
|---|---|---|
| JP | 2010-287879 (A) | 12/2010 |
| KR | 10-2011-0060370 (A) | 6/2011 |
| KR | 10-2011-0078835 (A) | 7/2011 |

* cited by examiner

*Primary Examiner* — Jeff Natalini
(74) *Attorney, Agent, or Firm* — Morgan, Lewis & Bockius LLP

(57) ABSTRACT

A non-contact sensing module includes a coil printed circuit board in which a reference pattern coil may be formed at an upper surface and in which a sensing pattern coil may be formed at a lower surface and that has a mounting hole at the center, and a main printed circuit board that may be coupled to the mounting hole and that may be vertically disposed at an upper surface of the coil printed circuit board and that may be electrically connected to the reference pattern coil and the sensing pattern coil.

4 Claims, 8 Drawing Sheets

FIG. 4
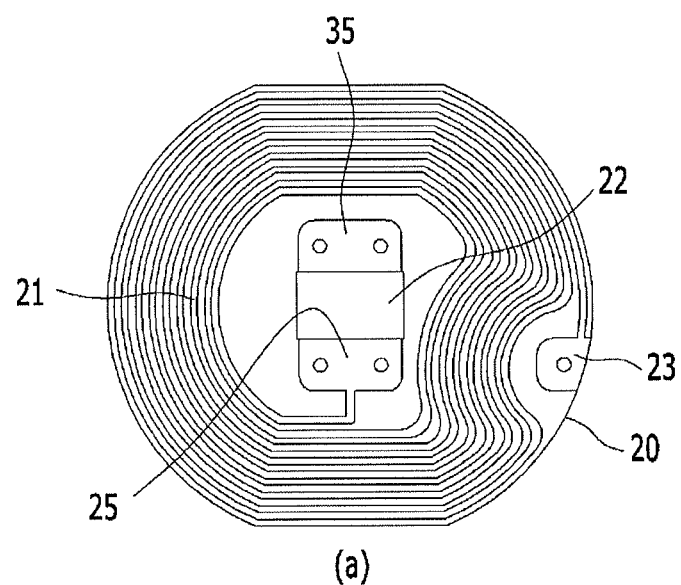
(a)
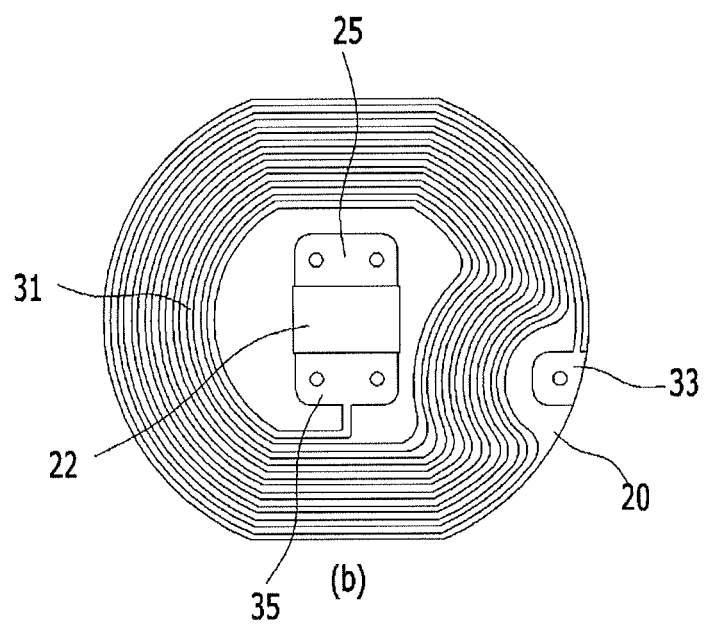
(b)

NON-CONTACT SENSING MODULE AND METHOD OF MANUFACTURING THE SAME

The present application is a Divisional of U.S. patent application Ser. No. 13/920,799, filed Jun. 18, 2013, the entire contents of which is incorporated herein for all purposes by this reference.

BACKGROUND OF THE INVENTION

Field of the Invention

The present invention relates to a non-contact sensing module and a method of manufacturing the same that can sense a displacement of a brake pedal and apply a switching signal thereof to a control system or a peripheral device of a vehicle.

Description of Related Art

In general, vehicles use a non-contact proximity sensor that senses a displacement (separation distance) of a sensing object and applies a predetermined switching signal to a vehicle control system or a peripheral device.

The non-contact proximity sensor senses a displacement of a metal material that is installed at a sensing object using an inductance (L) component of an LC oscillation circuit and performs a switching operation according to a sensing signal thereof and representatively includes, for example, a brake switch that is mounted in a brake pedal unit.

Here, the brake switch senses a displacement of a brake pedal and applies a switching signal to a braking lamp, an electronic relay, a starting device, an engine control unit, a braking control unit, and a transmission control unit.

In order to recognize a displacement of a metal material that is installed in a sensing object, a non-contact proximity sensor has a printed circuit board in which a coil is formed.

When the metal material of the sensing object approaches the coil, the non-contact proximity sensor generates an eddy current at a metal material surface by an electromagnetic induction phenomenon, and the eddy current disturbs a flux of inductance that is applied from the coil to change a waveform of an LC oscillation circuit, and by appropriately determining such a changed waveform, the non-contact proximity sensor may output a switching signal.

However, a conventional non-contact proximity sensor forms only a coil for recognizing a displacement of a sensing object in a printed circuit board, and because a means for guaranteeing that a displacement recognition of the sensing object is accurately performed is not separately provided, a sensing performance and reliability of the sensing object is deteriorated, and stability of a switching operation is deteriorated.

Further, in order to improve a sensing performance of a sensing object by a coil, a conventional non-contact proximity sensor may form a coil at both surfaces of a printed circuit board, and a two-layer both surface structure cannot connect a start point and an end point of each coil to a circuit material of the printed circuit board with.

That is, in the two-layer both surface structure of the printed circuit board, because each coil is interfered, it is impossible to form a connection path that connects each coil and a circuit material.

Accordingly, in order to form a coil at both surfaces of the printed circuit board, a connection path of each coil and a circuit material should be inevitably formed with a multi-layered structure of a four-layer, and this may increase a thickness of the printed circuit board and increase a production cost.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention are directed to providing a non-contact sensing module and a method of manufacturing the same having advantages of improving a sensing performance and reliability of a sensing object, securing stability of a switching operation, reducing a thickness of a printed circuit board with a both surface structure of two layers, and reducing a production cost.

A non-contact sensing module may include a coil printed circuit board in which a reference pattern coil is formed at an upper surface thereof and in which a sensing pattern coil is formed at a lower surface thereof wherein a mounting hole is formed at a center of the coil printed circuit board, and a main printed circuit board that is coupled to the mounting hole and that is disposed at the upper surface of the coil printed circuit board and that is electrically connected to the reference pattern coil and the sensing pattern coil.

The reference pattern coil and the sensing pattern coil are independently connected to the main printed circuit board through the mounting hole without interference from each other.

The main printed circuit board is connected by solder to the reference pattern coil and the sensing pattern coil perpendicular to the upper surface of the coil printed circuit board.

The reference pattern coil is wound in a predetermined times along a predetermined orbit at the upper surface of the coil printed circuit board, wherein a start tab thereof is disposed at an edge side of the upper surface of the coil printed circuit board, and wherein an end tab thereof is supported by both surfaces of the coil printed circuit board by passing through the mounting hole.

The sensing pattern coil is wound in a predetermined times along a predetermined orbit at a lower surface of the coil printed circuit board, wherein a start tab thereof is disposed at an edge side of the lower surface of the coil printed circuit board, and wherein an end tab thereof is supported by both surfaces of the coil printed circuit board by passing through the mounting hole.

The end tab of the reference pattern coil and the end tab of sensing pattern coil are separately disposed at the mounting hole.

The main printed circuit board is connected by solder to the end tab of the reference pattern coil and the end tab of the sensing pattern coil at the upper surface of the coil printed circuit board.

In a lower end portion of the main printed circuit board, a coupling protrusion that is coupled to the mounting hole of the coil printed circuit board is provided.

In a lower end portion of the main printed circuit board, a coupling protrusion that is coupled to the mounting hole of the coil printed circuit board is provided, and at both sides of the coupling protrusion, connection tabs that are connected to the end tab of the reference pattern coil and the end tab of the sensing pattern coil by the solder are each provided.

In another aspect of the present invention, a non-contact sensing module may include a sensing unit in which a reference pattern coil is formed at an upper surface of a coil printed circuit board and in which a sensing pattern coil is formed at a lower surface of the coil printed circuit board, and a signal processor that is formed in a main printed circuit board that is uprightly coupled to the coil printed circuit board and that processes a signal that is generated in the sensing unit, wherein the reference pattern coil and the sensing pattern coil are independently connected to the main printed circuit board without interference from each other.

The sensing unit may include a first LC oscillation circuit that is connected to the reference pattern coil and oscillates a reference frequency signal of an inductance value of the reference pattern coil, and a second LC oscillation circuit that is connected to the sensing pattern coil and oscillates a change frequency signal of an inductance value changing according to a displacement between the sensing pattern coil and a sensing object.

The signal processor may include an integral circuit that processes the reference frequency signal that is oscillated in the first LC oscillation circuit and the change frequency signal that is oscillated in the second LC oscillation circuit as a time function, a comparator that compares respective processing values that are processed in the integral circuit, and an output circuit that determines a comparison result in the comparator and that outputs a switching signal to a peripheral device interlocking with the sensing object.

The non-contact sensing module may further include a brake switch that senses a displacement of a brake pedal and that outputs a switching signal to a peripheral device of a vehicle.

In further another aspect of the present invention, a method of manufacturing a non-contact sensing module may include manufacturing a coil printed circuit board that forms a reference pattern coil at an upper surface thereof and a sensing pattern coil at a lower surface thereof, and coupling a main printed circuit board constituting a circuit material to the coil printed circuit board, and connecting the reference pattern coil and the sensing pattern coil to the main printed circuit board by solder without interference with the reference pattern coil and the sensing pattern coil.

The manufacturing of the coil printed circuit board may include forming a mounting hole at a center of the coil printed circuit board.

The manufacturing of the coil printed circuit board may further include forming the reference pattern coil along a predetermined orbit at an upper surface of the coil printed circuit board and forming the sensing pattern coil along a predetermined orbit at a lower surface thereof.

A start tab of the reference pattern coil is formed at an edge of the upper surface of the coil printed circuit board, and an end tab of the reference pattern coil is formed at an inside of the mounting hole, wherein a start tab of the sensing pattern coil is formed at an edge of the lower surface of the coil printed circuit board, and an end tab of the sensing pattern coil is formed at an inside of the mounting hole.

The coupling of the main printed circuit board may include forming a coupling protrusion in a lower end portion of the main printed circuit board and coupling the coupling protrusion to the mounting hole.

The connecting of the reference pattern coil and the sensing pattern coil may include connecting the end tab of the reference pattern coil and the end tab of the sensing pattern coil to the main printed circuit board by solder.

Therefore, in an exemplary embodiment of the present invention, because a reference pattern coil can guarantee that displacement recognition of a sensing object is accurately performed by a sensing pattern coil, reliability of the sensing unit can be enhanced and displacement recognition of the sensing object can be more accurately and detailedly performed, and stability of a switching operation can be secured.

In an exemplary embodiment of the present invention, because a reference pattern coil and a sensing pattern coil are formed at an upper surface and a lower surface of a coil printed circuit board, a malfunction by external noise of frequency interference that is injected into one pattern coil of the reference pattern coil and the sensing pattern coil can be prevented through another pattern coil.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 4 is a top plan view and a bottom view illustrating a coil printed circuit board that is applied to a non-contact sensing module according to an exemplary embodiment of the present invention.

Figure 1:
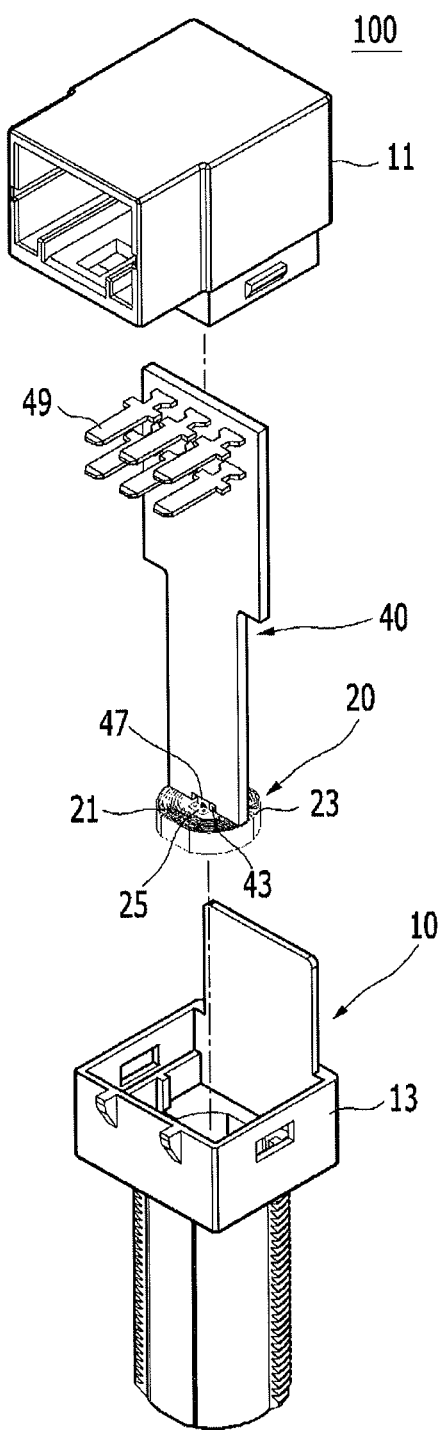
FIG. 1 is an exploded perspective view illustrating a non-contact sensing module according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

The drawings and description are to be regarded as illustrative in nature and not restrictive. Like reference numerals designate like elements throughout the specification.

Further, in the drawings, a size and thickness of each element are randomly represented for better understanding and ease of description, and the present invention is not limited thereto.

FIG. 1 is an exploded perspective view illustrating a non-contact sensing module according to an exemplary embodiment of the present invention.

Referring to FIG. 1, a non-contact sensing module 100 according to an exemplary embodiment of the present invention may be a non-contact proximity sensor that senses a displacement of a metal material that is attached to a sensing object 1.

For example, when a driver steps on a brake pedal for braking, the non-contact sensing module 100 may be applied to a vehicle brake switch that senses a displacement of the brake pedal as the sensing object 1 (see FIG. 7) and that converts the sensing signal to a switching signal and that outputs the switching signal to a peripheral device.

Here, the brake switch is mounted in a brake pedal unit, senses a displacement of a brake pedal by a driver, and applies a switching signal to a braking lamp, an electronic relay, a starting device, an engine control unit, a braking control unit, and a transmission control unit.

The non-contact sensing module 100 according to an exemplary embodiment of the present invention has a structure that senses the sensing object 1 using inductance (L) of an LC oscillation circuit and that performs a switching operation.

That is, when a metal material of the sensing object 1 approaches a magnetic field, the non-contact sensing module 100 generates an eddy current at a metal material surface by an electromagnetic induction phenomenon, and the eddy current changes a waveform of an LC oscillation circuit while disturbing a flux of inductance, the non-contact sensing module 100 appropriately determines such a waveform and senses a displacement of the sensing object 1.

The non-contact sensing module 100 according to an exemplary embodiment of the present invention basically includes a coil printed circuit board 20 and a main printed circuit board 40, and each element will be described in detail hereinafter.

Here, the coil printed circuit board 20 and the main printed circuit board 40 will be described in detail hereinafter and are formed within a housing 10 that is formed with an upper case 11 and a lower case 13.

The upper case 11 and the lower case 13 are provided to couple and separate to and from each other and may be fixedly installed in a brake pedal unit.

Hereinafter, a configuration of the coil printed circuit board 20 and the main printed circuit board 40, a coupling structure of the coil printed circuit board 20 and the main printed circuit board 40, and a method of manufacturing the same will be described in detail.

A circuit configuration and a signal transfer system of the coil printed circuit board 20 and the main printed circuit board 40 will be described in detail later.

Figure 2:
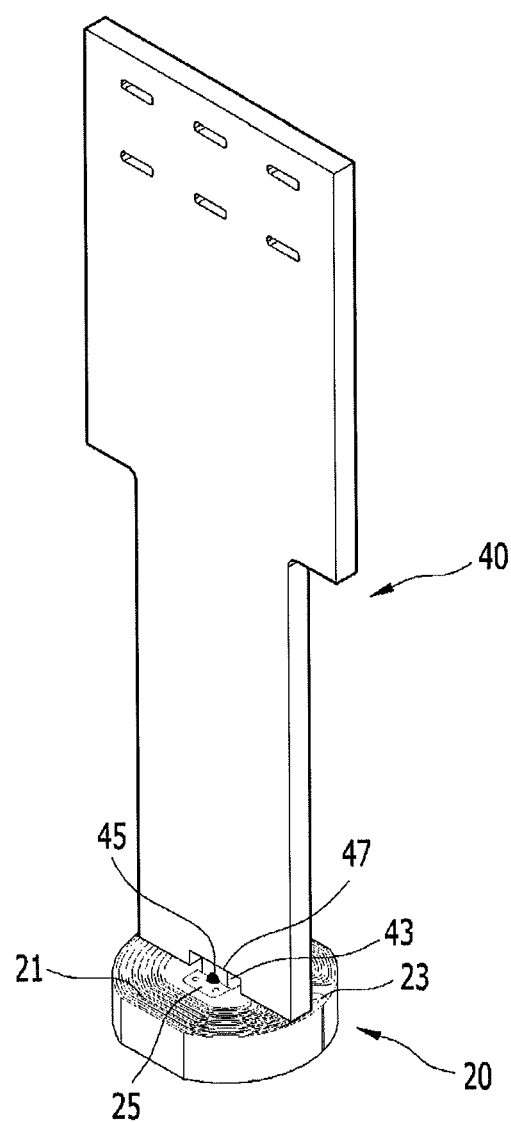
FIG. 2 and FIG. 3 are perspective views illustrating a coupling structure of a coil printed circuit board and a main printed circuit board that are applied to a non-contact sensing module according to an exemplary embodiment of the present invention.
Figure 3:
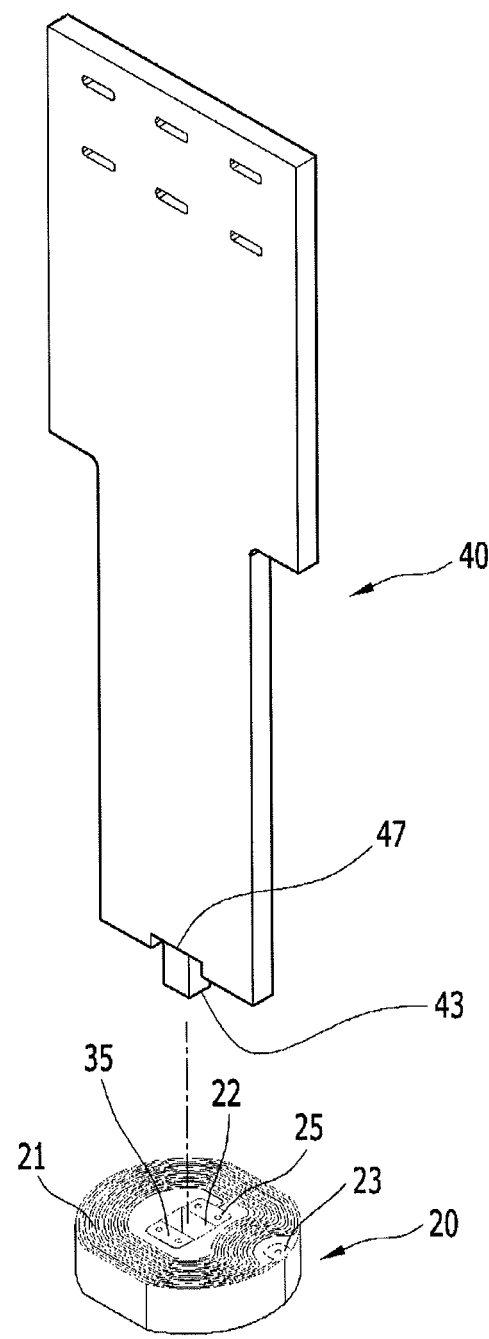

FIGS. 2 and 3 are perspective views illustrating a coupling structure of a coil printed circuit board and a main printed circuit board that are applied to a non-contact sensing module according to an exemplary embodiment of the present invention.

Referring to FIGS. 2 and 3, in an exemplary embodiment of the present invention, the coil printed circuit board 20 is formed in a circular substrate, and the main printed circuit board 40 has a plate form and is disposed at an upper surface of the coil printed circuit board 20.

Here, the main printed circuit board 40 is mounted in the coil printed circuit board 20 and may be vertically mounted at an upper surface of the coil printed circuit board 20.

For this purpose, in a central portion of the coil printed circuit board 20, a mounting hole 22 for mounting the main printed circuit board 40 is formed.

The mounting hole 22 is penetrated in a quadrangular form in a central portion of the coil printed circuit board 20.

In an exemplary embodiment of the present invention, in a state in which various circuit materials 41 (see FIG. 7) are formed, the main printed circuit board 40 is coupled in a vertically direction to the mounting hole 22 of the coil printed circuit board 20.

Accordingly, in a lower end portion of the main printed circuit board 40, a coupling protrusion 43 that is inserted into and coupled to the mounting hole 22 of the coil printed circuit board 20 is formed.

In the main printed circuit board 40, a terminal 49 for transferring a signal that is generated in various circuit materials 41 to various control systems of a vehicle is installed.

Figure 5:
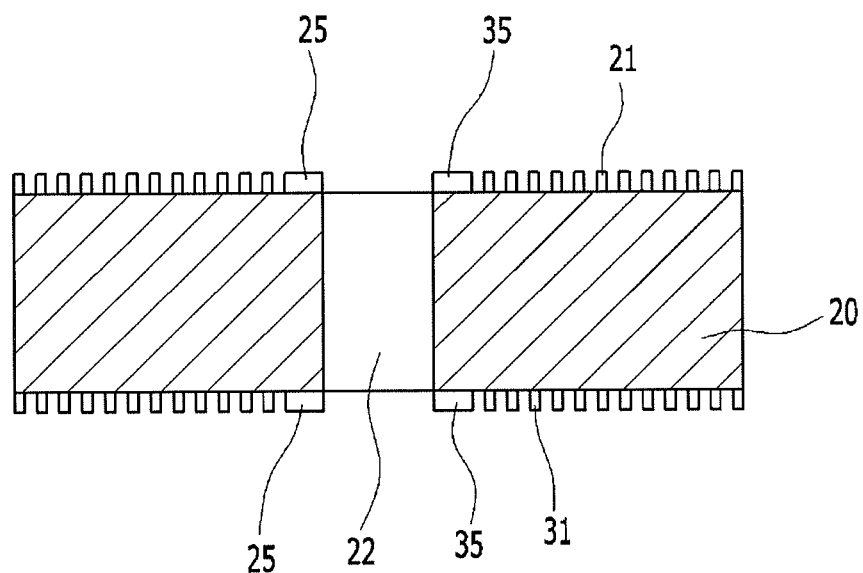
FIG. 5 is a cross-sectional view illustrating a coil printed circuit board that is applied to a non-contact sensing module according to an exemplary embodiment of the present invention.

FIG. 4 is a top plan view and a bottom view illustrating a coil printed circuit board that is applied to a non-contact sensing module according to an exemplary embodiment of the present invention, and FIG. 5 is a cross-sectional view illustrating a coil printed circuit board that is applied to a non-contact sensing module according to an exemplary embodiment of the present invention.

Referring to FIGS. 1 to 5, in an exemplary embodiment of the present invention, at an upper surface of the coil printed circuit board 20, a reference pattern coil 21 is formed, and at a lower surface thereof, a sensing pattern coil 31 is formed.

In an exemplary embodiment of the present invention, the reference pattern coil 21 is formed at an upper surface of the coil printed circuit board 20 and has a characteristic that an inductance value does not change regardless of whether the reference pattern coil 21 approaches a metal material of the sensing object 1.

The reference pattern coil 21 has a form circularly wound several times along a predetermined orbit at an upper surface of the coil printed circuit board 20.

Here, the reference pattern coil 21 includes a start tab 23 as a start terminal and an end tab 25 as an end terminal, and the start tab 23 is positioned at the edge side of an upper surface of the coil printed circuit board 20.

The end tab 25 is supported by both surfaces (an upper surface and a lower surface) of the coil printed circuit board 20 by passing through the mounting hole 22. In this case, the end tab 25 is electrically connected to the main printed circuit board 40.

In an exemplary embodiment of the present invention, when the sensing pattern coil 31 approaches a metal material of the sensing object 1, the sensing pattern coil 31 has a characteristic that an inductance value thereof changes.

The sensing pattern coil 31 is formed in a form circularly wound several times along a predetermined orbit at a lower surface of the coil printed circuit board 20.

Here, the sensing pattern coil 31 includes a start tab 33 as a start terminal and an end tab 35 as an end terminal, and the start tab 33 is positioned at the edge side of a lower surface of the coil printed circuit board 20.

The end tab 35 is supported by both surfaces (an upper surface and a lower surface) of the coil printed circuit board 20 by passing through the mounting hole 22 separately from the end tab 25 of the reference pattern coil 21. In this case, the end tab 35 is electrically connected to the main printed circuit board 40.

The reference pattern coil 21 and the sensing pattern coil 31 are separate elements, are formed at an upper surface and a lower surface, respectively of the coil printed circuit board 20, and are independently connected to the main printed circuit board 40 through the mounting hole 22 without interference from each pattern.

In this case, the reference pattern coil 21 and the sensing pattern coil 31 are electrically connected to the coupling protrusion 43 of the main printed circuit board 40 that is coupled to the mounting hole 22 of the coil printed circuit board 20.

Specifically, in a state in which the coupling protrusion 43 is coupled to the mounting hole 22 of the coil printed circuit board 20, the main printed circuit board 40 is electrically connected to the reference pattern coil 21 and the sensing pattern coil 31 by a solder 45.

That is, the main printed circuit board 40 is coupled to the mounting hole 22 of the coil printed circuit board 20 through the coupling protrusion 43 and is electrically connected to the end tab 25 of the reference pattern coil 21 and the end tab 35 of the sensing pattern coil 31 by the solder 45 at an upper surface of the coil printed circuit board 20.

In the main printed circuit board 40, at both side surfaces of the coupling protrusion 43, connection tabs 47 (see FIGS. 2 and 3) that are connected to the end tab 25 of the reference pattern coil 21 and the end tab 35 of the sensing pattern coil 31 by the solder 45 are each provided.

Hereinafter, a method of manufacturing the non-contact sensing module 100 according to an exemplary embodiment of the present invention will be described in detail with reference to the accompanying drawings.

Figure 6:
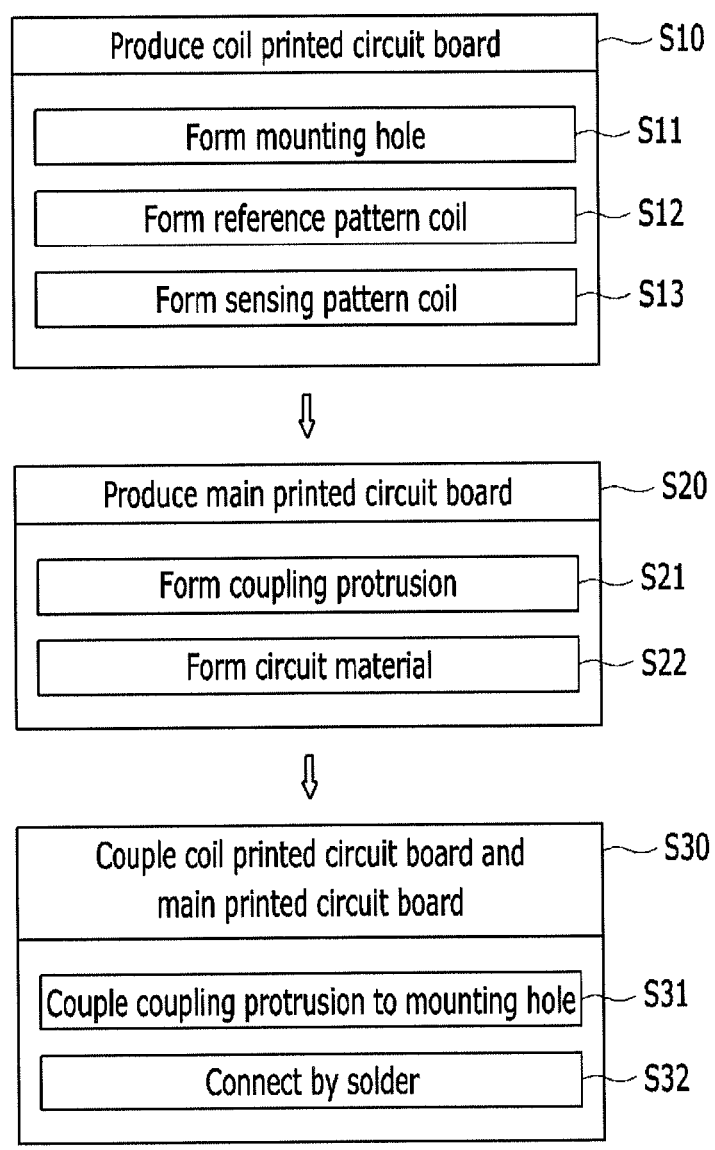
FIG. 6 is a flowchart illustrating a method of manufacturing a non-contact sensing module according to an exemplary embodiment of the present invention.

FIG. 6 is a flowchart illustrating a method of manufacturing a non-contact sensing module according to an exemplary embodiment of the present invention.

First, in an exemplary embodiment of the present invention, the coil printed circuit board 20 is produced (S10), the mounting hole 22 is formed in a central portion of the coil printed circuit board 20 (S11), the reference pattern coil 21 is formed at an upper surface of the coil printed circuit board 20 (S12), and the sensing pattern coil 31 is formed at a lower surface thereof (S13).

Here, in an exemplary embodiment of the present invention, at an upper surface of the coil printed circuit board 20, the reference pattern coil 21 is formed along a predetermined circular orbit.

In this case, the start tab 23 of the reference pattern coil 21 is formed at the edge of an upper surface of the coil printed circuit board 20, and the end tab 25 is formed at the inside of the mounting hole 22.

In an exemplary embodiment of the present invention, at a lower surface of the coil printed circuit board 20, the sensing pattern coil 31 is formed along a predetermined circular orbit.

The start tab 33 of the sensing pattern coil 31 is formed at the edge of a lower surface of the coil printed circuit board 20, and the end tab 35 is formed at the inside of the mounting hole 22 not to be overlapped with the end tab 25 of the reference pattern coil 21.

In an exemplary embodiment of the present invention, the main printed circuit board 40 is produced (S20), and the coupling protrusion 43 is formed in a lower end portion of the main printed circuit board 40 (S21), and various circuit materials 41 are mounted (S22).

As described above, when production of the coil printed circuit board 20 and the main printed circuit board 40 are complete, in an exemplary embodiment of the present invention, the coil printed circuit board 20 and the main printed circuit board 40 are coupled (S30).

Here, in an exemplary embodiment of the present invention, the coupling protrusion 43 of the main printed circuit board 40 is coupled to the mounting hole 22 of the coil printed circuit board 20 (S31), and the coil printed circuit board 20 and the main printed circuit board 40 are connected by the solder 45 (S32).

That is, in a state in which the coupling protrusion 43 of the main printed circuit board 40 is coupled to the mounting hole 22 of the coil printed circuit board 20, the connection tab 47 of the coupling protrusion 43, the end tab 25 of the reference pattern coil 21, and the end tab 35 of the sensing pattern coil 31 are connected by the solder 45.

In this way, by forming the reference pattern coil 21 and the sensing pattern coil 31 of the coil printed circuit board 20 at an upper surface and a lower surface of the coil printed circuit board 20, respectively and by forming the end tabs 25 and 35 of the reference pattern coil 21 and the sensing pattern coil 31 in the mounting hole 22, the reference pattern coil 21 and the sensing pattern coil 31 are independently connected to the main printed circuit board 40 without interference from each other.

Therefore, when the coil printed circuit board 20 and the main printed circuit board 40 are produced through the above-described series of process and are mounted at the inside of the housing 10 in a state in which the coil printed circuit board 20 and the main printed circuit board 40 are coupled, production of the non-contact sensing module 100 according to an exemplary embodiment of the present invention is complete.

The non-contact sensing module 100 according to an exemplary embodiment of the present invention is mounted in a brake pedal unit through the housing 10, and the terminal 49 of the main printed circuit board 40 is connected to a control system of the vehicle.

In the foregoing method of manufacturing the non-contact sensing module 100 according to an exemplary embodiment of the present invention, the coil printed circuit board 20 is produced, the main printed circuit board 40 is produced, and the coil printed circuit board 20 and the main printed circuit board 40 are connected.

However, the present invention is not limited to a production order of the coil printed circuit board 20 and the main printed circuit board 40, and the main printed circuit board 40 may be first produced, and the coil printed circuit board 20 may be produced.

As described above, the non-contact sensing module 100 according to an exemplary embodiment of the present invention includes the coil printed circuit board 20 in which the reference pattern coil 21 that is not interfered by the sensing object 1 is formed at an upper surface and in which the sensing pattern coil 31 having an inductance value changing according to a displacement of the sensing object 1 is formed at a lower surface.

In the non-contact sensing module 100 according to an exemplary embodiment of the present invention, the main printed circuit board 40 is coupled to the coil printed circuit board 20, and the reference pattern coil 21 and the sensing pattern coil 31 of the coil printed circuit board 20 are connected to the main printed circuit board 40 by the solder 45.

Therefore, in an exemplary embodiment of the present invention, the coil printed circuit board 20 in which the reference pattern coil 21 and the sensing pattern coil 31 are formed at an upper surface and a lower surface, respectively and that has the mounting hole 22 at the center is formed, and the main printed circuit board 40 is coupled to the mounting hole 22 and thus a two-layer printed circuit board may be formed.

Thereby, in an exemplary embodiment of the present invention, in order to form a pattern coil at both surfaces of a printed circuit board, unlike the conventional art of forming the printed circuit board in a multi layer of four layers, because a two-layer printed circuit board that forms the reference pattern coil 21 and the sensing pattern coil 31 at both surface can be formed, a thickness of a printed circuit board can be reduced and a cost can be reduced according to reduction of the layer number.

Hereinafter, a circuit configuration and a signal transfer system of the coil printed circuit board 20 and the main printed circuit board 40 of the non-contact sensing module 100 according to an exemplary embodiment of the present invention will be described in detail with reference to the accompanying drawings.

Figure 7:
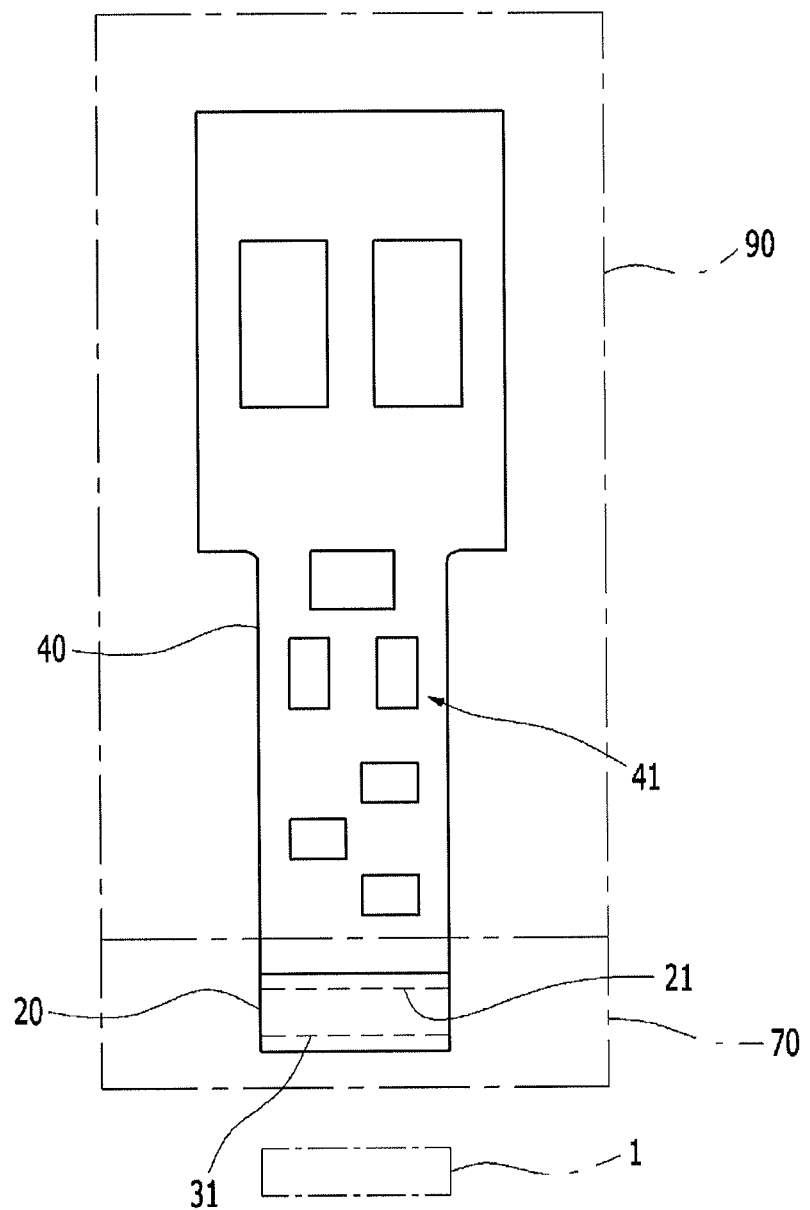
FIG. 7 and FIG. 8 are diagrams illustrating a circuit configuration and a signal transfer system of a non-contact sensing module according to an exemplary embodiment of the present invention.
Figure 8:
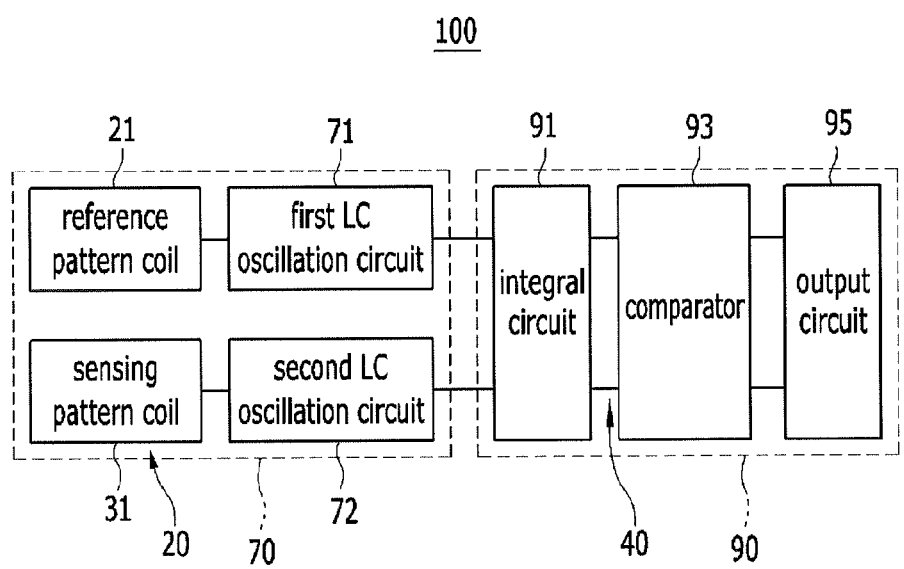

FIGS. 7 and 8 are diagrams illustrating a circuit configuration and a signal transfer system of a non-contact sensing module according to an exemplary embodiment of the present invention.

Referring to FIGS. 7 and 8, the non-contact sensing module 100 according to an exemplary embodiment of the present invention includes a sensing unit 70 that senses a displacement of the sensing object 1 and a signal processor 90 that processes a signal that is generated in the sensing unit 70.

In an exemplary embodiment of the present invention, the sensing unit 70 includes a reference pattern coil 21 that is formed at an upper surface of the coil printed circuit board 20 and a sensing pattern coil 31 that is formed at a lower surface of the coil printed circuit board 20.

The sensing unit 70 includes a first LC oscillation circuit 71 that oscillates a reference frequency signal for an inductance value of the reference pattern coil 21 and a second LC oscillation circuit 72 that oscillate a change frequency signal of an inductance value changing according to a displacement between the sensing pattern coil 31 and the sensing object 1.

The LC oscillation circuits 71 and 72 are a general LC oscillation circuit that is well known in the art and therefore a detailed description thereof will be omitted.

In an exemplary embodiment of the present invention, the signal processor 90 includes a circuit material 41 of the main printed circuit board 40 that is uprightly coupled to the coil printed circuit board 20 and that is electrically connected to the reference pattern coil 21 and the sensing pattern coil 31 of the coil printed circuit board 20.

Here, the signal processor 90 includes an integral circuit 91 that processes a reference frequency signal and a change frequency signal that are oscillated in the first and second LC oscillation circuits 71 and 72 as a time function, a comparator 93 that compares respective processing values that are processed in the integral circuit 91, and an output circuit 95 that determines a comparison result in the comparator 93 to output a switching signal to a control system or a peripheral device of a vehicle.

Constituent elements of the signal processor 90 including the integral circuit 91, the comparator 93, and the output circuit 95 may be a well-known signal processing device that is widely used in the art.

Hereinafter, a signal transfer system of the non-contact sensing module 100 according to an exemplary embodiment of the present invention having the above-described configuration will be described in detail.

First, when a metal material of a brake pedal as the sensing object 1 approaches the sensing pattern coil 31 of the sensing unit 70, an eddy current occurs at a surface of the metal material by an electromagnetic induction phenomenon.

Such an eddy current disturbs a flux of inductance that is applied from the sensing pattern coil 31, and an inductance value of the sensing pattern coil 31 changes according to a distance change between the sensing object 1 and the sensing pattern coil 31.

Therefore, the second LC oscillation circuit 72 oscillates a change frequency signal changing together according to a change of an inductance value that is applied from the sensing pattern coil 31.

That is, when the eddy current disturbs a flux of inductance that is applied from the sensing pattern coil 31, a waveform of the second LC oscillation circuit 72 may change.

Here, the reference pattern coil 21 that is not interfered by a metal material of the sensing object 1 applies inductance that does not change by an eddy current, and the first LC oscillation circuit 71 oscillates a reference frequency signal of an inductance value of the reference pattern coil 21.

Accordingly, the signal processor 90 processes a signal that is generated in the sensing unit 70, and the integral circuit 91 of the signal processor 90 processes a reference frequency signal and a change frequency signal that are oscillated in the first and second LC oscillation circuits 71 and 72 as a time function.

The comparator 93 compares respective processing values that are processed in the integral circuit 91, and the output circuit 95 appropriately determines a comparison result in the comparator 93 and outputs a switching signal to a peripheral device or a control system of the vehicle.

For example, the output circuit 95 determines a displacement of a brake pedal, which is the sensing object 1 based on a reference frequency signal and a change frequency signal that are oscillated in the first and second LC oscillation circuits 71 and 72 and applies a switching signal to a braking lamp, an electron relay, a starting device, an engine control unit, a braking control unit, and a transmission control unit.

As described above, in the non-contact sensing module 100 according to an exemplary embodiment of the present invention, because the reference pattern coil 21 that is not interfered by the sensing object 1 and in which an inductance value does not change and the sensing pattern coil 31 in which an inductance value changes according to a displacement of the sensing object 1 are formed at both surfaces of the coil printed circuit board 20, the reference pattern coil 21 can guarantee a displacement of the sensing object 1 that is recognized by the sensing pattern coil 31.

Thereby, in an exemplary embodiment of the present invention, because the reference pattern coil 21 can guarantee that displacement recognition of the sensing object 1 is accurately performed by the sensing pattern coil 31, reliability of the sensing unit 70 can be enhanced, displacement recognition for the sensing object 1 can be more accurately and detailedly performed, and stability of a switching operation can be secured Further, in an exemplary embodiment of the present invention, a malfunction by external noise such as interference of a frequency that is injected into one pattern coil of the reference pattern coil 21 and the sensing pattern coil 31 can be prevented through another pattern coil.

For convenience in explanation and accurate definition in the appended claims, the terms "upper", "lower", "inner" and "outer" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise forms disclosed, and obviously many modifications and variations are possible in light of the above teachings. They are not intended to be exhaustive or to limit the invention to the precise forms disclosed, and obviously many modifications and variations are possible in light of the above teachings. as well as various alternatives and modifications thereof. It is intended that the scope of the invention be defined by the Claims appended hereto and their equivalents.

What is claimed is:

1. A non-contact sensing module, comprising:
    a sensing unit in which a reference pattern coil is formed at an upper surface of a coil printed circuit board and in which a sensing pattern coil is formed at a lower surface of the coil printed circuit board; and
    a signal processor formed in a main printed circuit board that is uprightly coupled to the coil printed circuit board wherein the signal processor processes a signal generated in the sensing unit,
    wherein the reference pattern coil and the sensing pattern coil are independently connected to the main printed circuit board without interference from each other,
    wherein a mounting hole is formed at a center of the coil printed circuit board,
    wherein the reference pattern coil is wound in a predetermined number of times at the upper surface of the coil printed circuit board,
    wherein a start tab of the reference pattern coil is disposed at an edge side of the upper surface of the coil printed circuit board,
    wherein an end tab of the reference pattern coil is supported by both surfaces of the coil printed circuit board by passing through the mounting hole,
    wherein the sensing pattern coil is wound in a predetermined number of times at the lower surface of the coil printed circuit board,
    wherein a start tab of the sensing pattern coil is disposed at an edge side of the lower surface of the coil printed circuit board, and
    wherein an end tab of the sensing pattern coil is supported by both surfaces of the coil printed circuit board by passing through the mounting hole.

2. The non-contact sensing module of claim 1, wherein the sensing unit includes
    a first LC oscillation circuit connected to the reference pattern coil and oscillating a reference frequency signal of an inductance value of the reference pattern coil; and
    a second LC oscillation circuit connected to the sensing pattern coil and oscillating a change frequency signal of an inductance value changing according to a displacement between the sensing pattern coil and a sensing object.

3. The non-contact sensing module of claim 2, wherein the signal processor includes:
    an integral circuit processing the reference frequency signal oscillated in the first LC oscillation circuit and the change frequency signal oscillated in the second LC oscillation circuit as a time function;
    a comparator comparing respective processing values processed in the integral circuit; and
    an output circuit determining a comparison result in the comparator and outputting a switching signal to a peripheral device interlocking with the sensing object.

4. The non-contact sensing module of claim 1, further including a brake switch sensing a displacement of a brake pedal and outputting a switching signal to a peripheral device of a vehicle.

* * * * *